(12) United States Patent
Laturell et al.

(10) Patent No.: US 7,209,525 B2
(45) Date of Patent: Apr. 24, 2007

(54) CLOCK AND DATA RECOVERY WITH EXTENDED INTEGRATION CYCLES

(75) Inventors: Donald R. Laturell, Allentown, PA (US); Peter C. Metz, Macungie, PA (US); Baiying Yu, St. Paul, MN (US)

(73) Assignee: Agere Systems Inc., Allentown, PA (US)

( * ) Notice: Subject to any disclaimer, the term of this patent is extended or adjusted under 35 U.S.C. 154(b) by 728 days.

(21) Appl. No.: 10/298,892

(22) Filed: Nov. 18, 2002

(65) Prior Publication Data

US 2004/0096013 A1    May 20, 2004

(51) Int. Cl.
*H03K 9/00*    (2006.01)
*H04L 27/00*   (2006.01)
*H04B 1/00*    (2006.01)

(52) U.S. Cl. .................. 375/316; 375/142; 375/150
(58) Field of Classification Search ................ 375/316, 375/355, 130, 136, 142, 147, 150; 455/230, 455/324

See application file for complete search history.

(56) References Cited

U.S. PATENT DOCUMENTS

| | | | | |
|---|---|---|---|---|
| 5,090,026 A | * | 2/1992 | Stern et al. | 375/274 |
| 5,832,027 A | * | 11/1998 | Ishigaki | 375/149 |
| 5,953,370 A | * | 9/1999 | Durrant et al. | 375/150 |
| 6,091,688 A | * | 7/2000 | Tanoue et al. | 369/47.35 |
| 6,154,487 A | * | 11/2000 | Murai et al. | 375/150 |
| 6,301,291 B1 | * | 10/2001 | Rouphael et al. | 375/150 |
| 6,516,185 B1 | * | 2/2003 | MacNally | 455/234.1 |
| 2002/0025012 A1 | * | 2/2002 | Saito et al. | 375/344 |
| 2002/0031093 A1 | * | 3/2002 | Gfeller et al. | 370/252 |
| 2002/0159542 A1 | * | 10/2002 | Kokkonen et al. | 375/324 |
| 2003/0101396 A1 | * | 5/2003 | Price | 714/726 |
| 2004/0066842 A1 | * | 4/2004 | McCorkle | 375/148 |
| 2004/0091028 A1 | * | 5/2004 | Aronson et al. | 375/219 |

OTHER PUBLICATIONS

"A Semidigital Dual Delay-Locked Loop" by Stefanos Sidiropoulous and Mark A. Horowitz, IEEE Journal of Solid-State Circuits, vol. 32, No. 11, Nov. 1997, pp. 1683-1692.

* cited by examiner

*Primary Examiner*—Khai Tran
*Assistant Examiner*—Aslan Ettehadieh

(57) ABSTRACT

Clock and data recovery circuitry includes an interleaved sampler having multiple integrators, where at least one of the integrators integrates the input data for at least two unit intervals (UIs). One embodiment includes a four-way interleaved sampler, where each integrator in the sampler integrates the input data for two UIs, where each integrator is sampled at or near the middle of its two-UI integration cycle. In an exemplary 10-GHz system, the reset cycle of each integrator may begin many tens of picoseconds after the data is sampled. Since the signal is sampled near the center of the integration cycle and is not highly proximate to the time of the integrator reset, the latch signal has a window of uncertainty extending into the length of a data bit cell with little possibility of latching erroneous data. The sensitivity of the clock recovery circuitry may be optimized by centering the latch function over the time of highest signal level, thereby maximizing signal-to-noise ratio.

18 Claims, 7 Drawing Sheets

| Row# | A (OD$_n$) | B (OT$_m$) | C (OD$_{n+1}$) | D (FASTm) | E (SLOWm) | Comment |
|---|---|---|---|---|---|---|
| 1 | 0 | 0 | 0 | 0 | 0 | Don't care |
| 2 | 0 | 0 | 1 | 1 | 0 | Fast |
| 3 | 0 | 1 | 0 | 0 | 0 | Don't care |
| 4 | 0 | 1 | 1 | 0 | 1 | Slow |
| 5 | 1 | 0 | 0 | 0 | 1 | Slow |
| 6 | 1 | 0 | 1 | 0 | 0 | Don't care |
| 7 | 1 | 1 | 0 | 1 | 0 | Fast |
| 8 | 1 | 1 | 1 | 0 | 0 | Don't care |

TABLE 1

FIG. 7

CLOCK AND DATA RECOVERY WITH EXTENDED INTEGRATION CYCLES

BACKGROUND OF THE INVENTION

Field of the Invention

The present invention relates to clock and data recovery systems and, more specifically, to integrator-based front ends and bang-bang phase detectors for clock and data recovery.

RELATED APPLICATIONS

The subject matter of this application is related to the subject matter of U.S. patent application Ser. No. 09/947,488, filed on Sep. 6, 2001, and U.S. patent application Ser. No. 09/955,424, filed on Sep. 18, 2001, the teachings of both of which are incorporated herein by reference.

DESCRIPTION OF THE RELATED ART

High-speed (e.g., 2.5–3.125 Gb/s) serial links are commonly used for chip-to-chip interconnects in high-speed network systems. For example, synchronous optical network (SONET) OC-768 applications may utilize 16 channels of 2.5 GB/s to support full duplex I/O of 40 GB/s. Many high-speed communications systems use asynchronous communication, where data is transmitted without a separate clock signal. Since a separate clock signal is not used, at a receiver side of a communications system, clock recovery circuitry is employed to extract intrinsic clock information from incoming data signals. Once extracted, the recovered clock is then used to re-time and regenerate the data originally transmitted. Such a clock and data recovery (CDR) circuit typically includes a voltage-controlled oscillator, a phase-locked loop (PLL), and/or a delay-locked loop (DLL) circuit as part of the clock recovery circuit, as well as deserialization logic as part of the data recovery circuit. Various techniques are used within CDR systems. Many of these are discussed in Sidiropoulos, S., and Horowitz, M., "A Semidigital Dual Delay-Locked Loop," IEEE Journal of Solid-State Circuits, vol. 32, no. 11, November 1997, incorporated herein by reference.

Generally, CDR systems suffer from extreme sensitivity to clock skew between clock domains within the CDR circuit. This is because, in these systems, the goal is to generate recovered clock edges which are ideally located to allow registration of the incoming data at a point of maximum signal quality. Given the high-speed nature of these systems and the relatively low noise margin, even minor errors in the alignment of clock edges to data availability may result in erroneous data being captured. Managing this problem in the context of a typical GHz-rate deserializer requires extreme care to be used in matching of the clock paths and balancing of the clock distribution system. In a typical 10 GHz system, the allowable timing uncertainty when the system is set for maximum sensitivity can be as low as 5 ps. Alternatively, accepting a greater timing uncertainty reduces jitter tolerance due to degraded signal-to-noise ratio (SNR).

SUMMARY OF THE INVENTION

To address the above-discussed deficiencies of the prior art, clock and data recovery circuitry according to one embodiment of the present invention includes a four-way interleaved sampler, where each integrator in the sampler integrates the input data for two unit intervals (UIs) and each integrator is sampled at or near the middle of its two-UI integration cycle. In an exemplary 10-GHz system, the reset cycle of each integrator may begin many tens of picoseconds after the data is sampled. Since the signal is sampled near the center of the integration cycle and is not highly proximate to the time of the integrator reset, the latch signal has a window of uncertainty extending into the length of a data bit cell with little possibility of latching erroneous data. The sensitivity of the clock recovery circuitry may be optimized by centering the latch function over the time of highest signal level, thereby maximizing signal-to-noise ratio.

In one embodiment, the present invention is a method for recovering data from an input data stream. The method includes integrating the input data stream using multiple independent integrators that are operating out-of-phase relative to one another, wherein at least one integrator has an integration period of more than one unit interval (UI) and processing the output of each integrator to recover the data from the input data stream.

In one embodiment, the present invention is an apparatus for recovering data from an input data stream. The apparatus includes multiple independent integrators configured to integrate the input data stream, wherein the integrators operate out-of-phase relative to one another, wherein at least one integrator has an integration period of more than one unit interval (UI). It also includes circuitry configured to process the output of each integrator to recover the data from the input data stream.

BRIEF DESCRIPTION OF THE DRAWINGS

Other aspects, features, and advantages of the present invention will become more fully apparent from the following detailed description, the appended claims, and the accompanying drawings in which:

FIG. 7 depicts TABLE 1, which summarizes the logic of F/S logic gates 602 and 604 of FIG. 6.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Note that, throughout this text and in the figures, a signal name with lowercase "p" or "n" appended to it, is used to indicate the "positive" or "negative" element, respectively, of a differential pair. Similarly, an uppercase "B" for "bar"

appended to a signal name (potentially prior to an appended lowercase "p" or "n") is used to indicate the inverted copy of that signal. Finally, an uppercase "Q" appended to a signal name indicates that it is the quadrature-phase (i.e., 90-degree) shifted version of that signal. For example CLK2I is the collective name for the differential signal pair consisting of CLK2Ip and CLK2In, CLK2IB is the inverted version of CLK2I, and CLK2QB is an inverted copy of the quadrature-phase shifted version of CLK2I.

Figure 1:
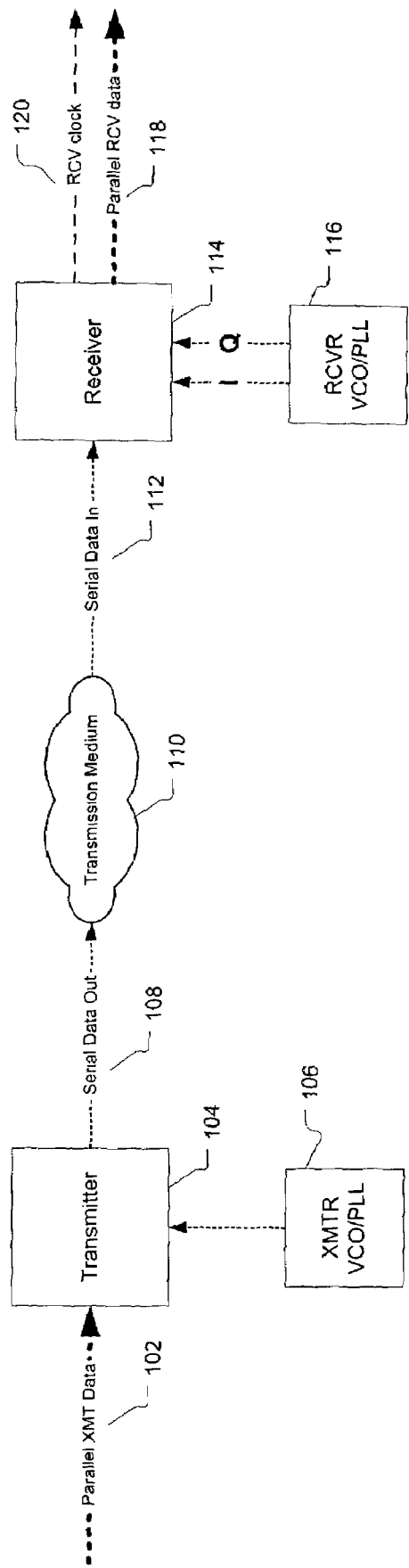
FIG. 1 is a block diagram illustrating an asynchronous serializer/deserializer (SerDes) communications system in accordance with one embodiment of the present invention.

Note also that, in FIGS. 1, 2, 3, 5, and 6, dotted lines are used to represent differential signal pairs. For example, the dotted line labeled "Serial Data In" (SDIN) 112 in FIG. 1, represents, collectively, SDINp and SDINn, the positive and negative elements, respectively, of the differential pair SDIN 112. Thick lines are used to designate a bus, while thin lines are used to indicate a single signal.

Serializer/Deserializer Systems

FIG. 1 is a block diagram illustrating an asynchronous serializer/deserializer (SerDes) communications system in accordance with one embodiment of the present invention. In FIG. 1, parallel transmit (XMT) data vector 102 is fed to transmitter 104. Transmitter 104 receives the parallel data along with the differential transmission clock from transmitter-local voltage-controlled oscillator (VCO) and/or phase-locked loop (PLL) 106. The transmitter loads the parallel data into a shift register and uses the I and Q clocks to generate a transmit clock, which is used to serially "clock-out" the contents of the shift register. The resulting serial data out 108 is output from transmitter 104 and transmitted across transmission medium 110 to receiver 114. At receiver 114, serial data in 112 is received, sampled with a local clock that is a function of I and Q clocks from receiver-local VCO/PLL 116, and deserialized into parallel receive (RCV) data vector 118, which is output along with RCV clock (PRC) 120.

Receiver Overview

Figure 2:
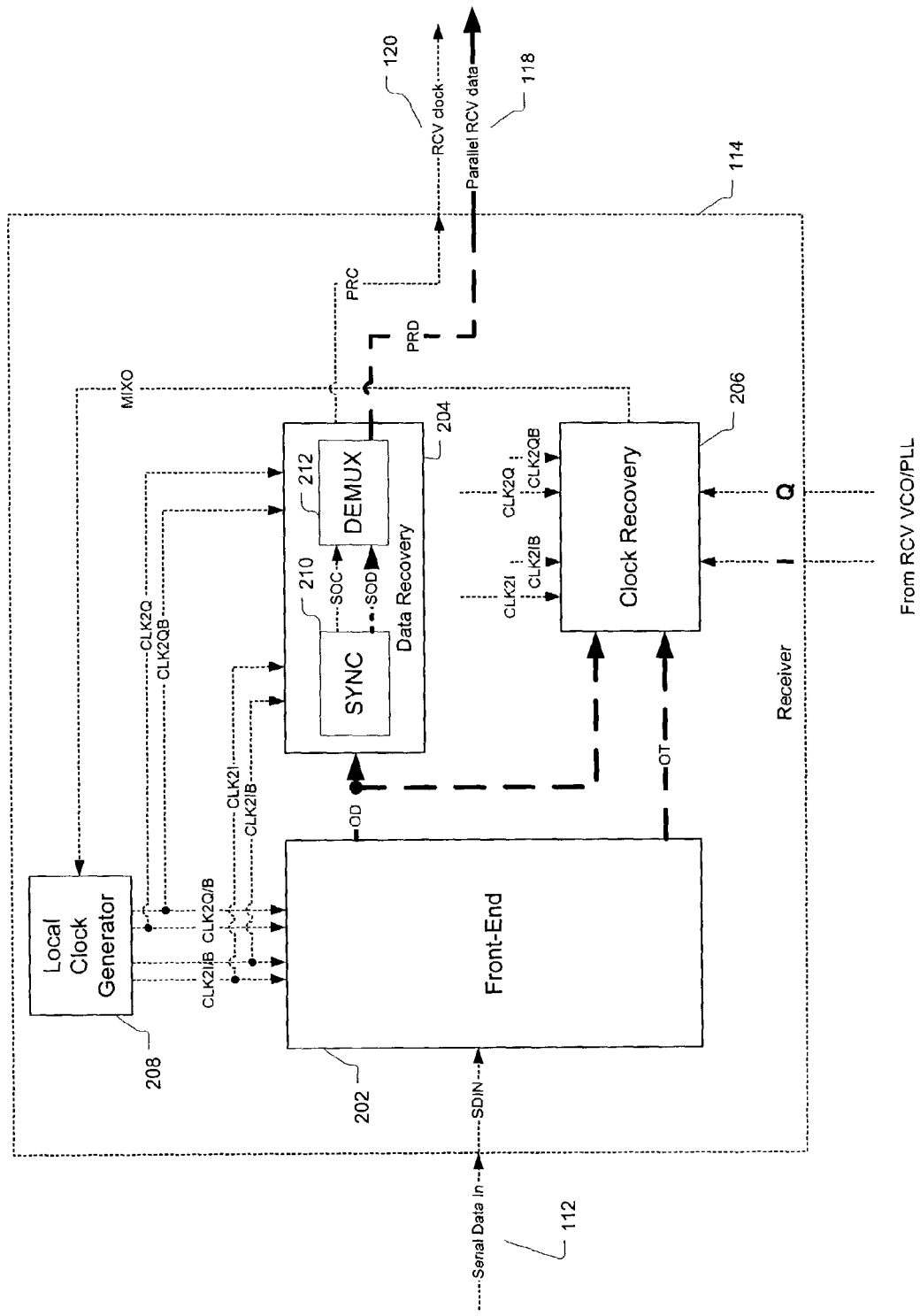
FIG. 2 is a top-level block diagram illustrating receiver 114 of FIG. 1.

FIG. 2 is a top-level block diagram illustrating the internals of receiver 114 of FIG. 1. The receiver includes four major circuits: (1) front-end 202, (2) data recovery circuit 204, (3) clock recovery circuit 206, and (4) local clock generator 208. The receiver performs two major functions: (1) clock recovery and (2) data recovery. The clock recovery function is divided between front-end 202, clock recovery block 206, and local clock generator 208 as well as data recovery circuit 204. The data recovery function is divided between front-end 202 and data recovery circuit 204.

Essentially, the clock recovery function serves to generate one or more local sampling clocks that are phase and frequency synchronized with the data transitions of the incoming data. Front-end 202 serves, among other things, to sample the data transitions and integration results of the incoming data and provide this information to a phase detector within clock recovery circuit 206. A delay-locked loop (DLL), also within clock recovery circuit 206 uses the outputs of the phase detector to create an adjusted version, MIXO, of the local reference I and Q clocks. Local clock generator circuit 208 (which is different from RCVR VCO/PLL 116 of FIG. 1) then uses MIXO to generate quarter-rate local sampling clocks CLK2I, CLK2IB, CLK2Q, and CLK2QB, and finally data recovery circuit 204 is used to divide down and further shift out the local sampling clocks to provide the parallel data receive clock PRC 120.

In one possible implementation, front-end 202 and data recovery circuit 204 use these local sampling clocks to sample, synchronize, and demultiplex (i.e., deserialize) the incoming serial data to achieve 16-bit parallel differential receive data vector (PRD) 118 clocked at one-sixteenth the incoming serial data rate. In alternative implementations, PRD 118 may have a different number of bits per vector (e.g., 20 bits), and the output clock rate may be a different fraction of the incoming serial data rate (e.g., one-twentieth). In some implementations, the size and corresponding timing of the output may be configurable between two or more different sets of values (e.g., either 16-bit or 20-bit data).

Front-End

Figure 3:
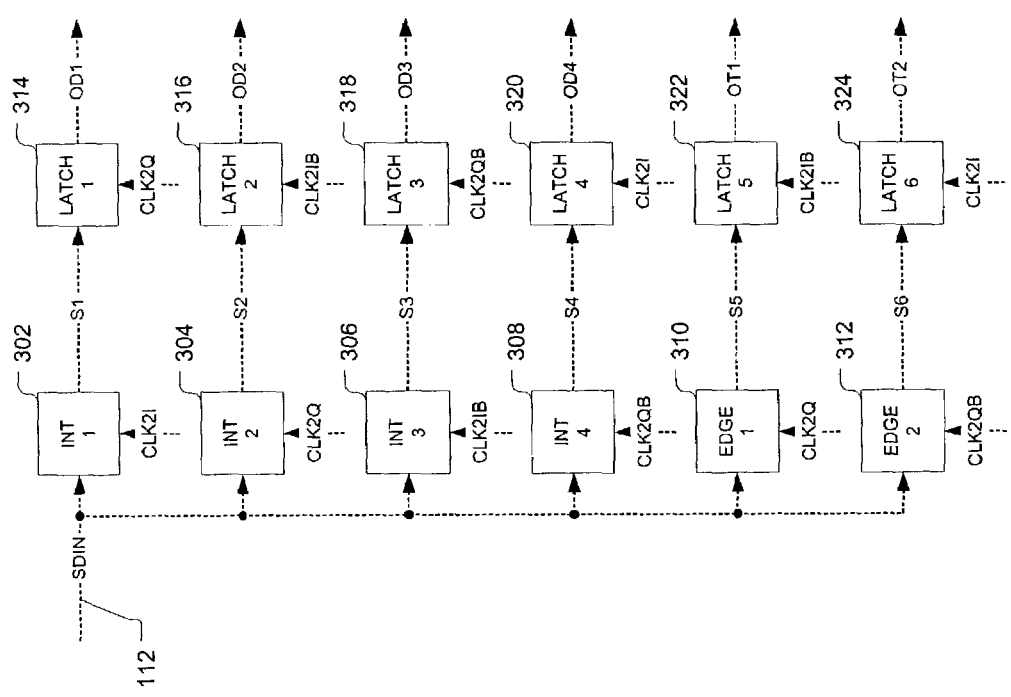
FIG. 3 is a block diagram illustrating front-end 202 of FIG. 2.

FIG. 3 is a block diagram illustrating front-end 202 of FIG. 2. As illustrated, front-end 202 includes four integration circuits 302, 304, 306, and 308 and two edge samplers 310 and 312, each of which receives SDIN 112 and one of the four clock signals generated by local clock generator 208 of FIG. 2. In addition, front-end 202 includes six latches 314, 316, 318, 320, 322, and 324, each of which receives a differential signal pair Si from a corresponding integrator or edge sampler, i=1 to 6. Each latch corresponding to an integrator outputs a different bit of 4-bit output data vector OD, and each latch corresponding to an edge sampler outputs a different bit of 2-bit output timing vector OT.

Integrators

An integrator functions by integrating an input signal while its clock input is high and holding its output in reset while its clock input is low. In FIG. 3, each of integrators 302, 304, 306, and 308 integrates SDIN 112 corresponding to the period during which each integrator's corresponding integration clock is logic "1" and then holds its output in reset corresponding to the period during which each integrator's integration clock is logic "0." The integration clocks for integrators 302–308 are CLK2I, CLK2Q, CLK2IB, and CLK2QB, respectively.

For example, INT 1 302 integrates SDIN 112 while the differential clock pair CLK2Ip and CLK2In (collectively represented by CLK2I) corresponds to logic "1." This occurs when CLK2Ip is positive and CLK2In is negative. During this time, signal S1 reflects the integration of the voltage corresponding to SDIN 112. When CLK2I corresponds to logic "0," the output of INT 1 302 is held in reset. During this time, both S1$p$ and S1$n$ are held at, or near, 0 volts differential.

Since the integration clocks CLK2I, CLK2Q, CLK2IB, and CLK2IB are quarter-rate clocks, the high (and low) period for each integration clock is approximately two unit intervals (UIs). As such, the period of integration (and reset) for each integrator is also about two UIs. Since the integration clocks, by design, are phase aligned to SDN 112 data transitions, the result is that each integrator performs the integration of two sequential bits of SDN 112 at a time. Further, as a result of the relative phasing of the clocks chosen for each integrator, the integration periods for adjacent integrators are overlapped by about one UI. Note that if the integration clocks were only high for only one UI, then no such overlap would occur.

Figure 4:
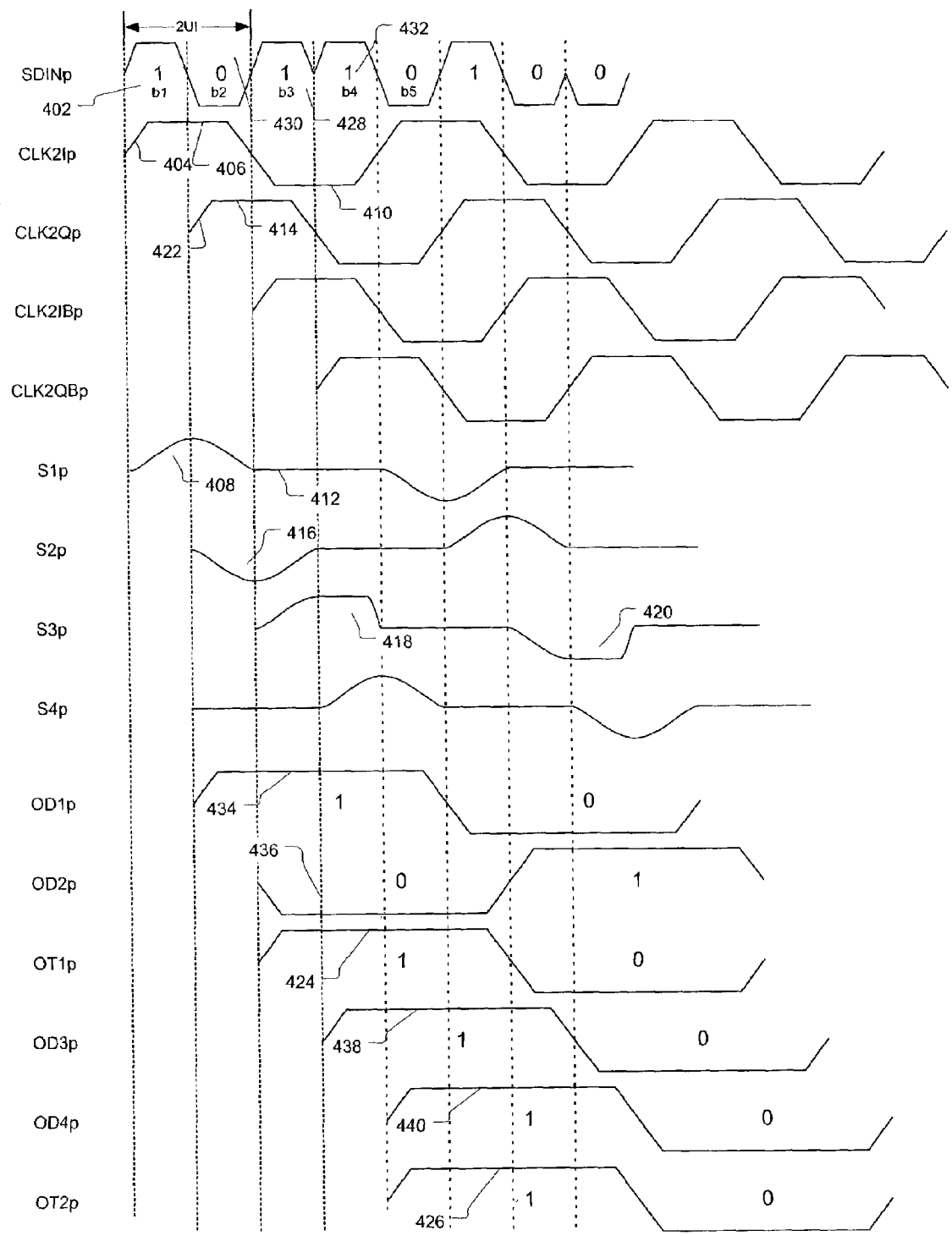
FIG. 4 is a timing diagram of the signals associated with front-end 202 of FIG. 2.

For example, referring to FIG. 4, SDINp is illustrated as a series 402 of data values {b1, b2, b3, b4, b5, ... }, where b1 is both the first bit following the rising edge 404 of CLK2Ip as well as the first data bit into front-end 202 of FIG. 3. As illustrated in FIG. 4, when CLK2Ip is positive (406), INT 1 302 of FIG. 3 integrates the values of b1 and b2, resulting in the bell-shaped segment 408 of S1$p$, where S1$p$ is seen to first rise to a maximum positive value corresponding to the integration of b1 of value "1," and then slope back down to "0" corresponding to the integration of b2 of value "0." Next, when CLK2Ip goes negative (410) corresponding to CLK2I being logic "0," S1$p$ is shown to be held in reset (412).

Similarly, when CLK2Qp is positive EH, INT 2 304 of FIG. 3 integrates the values of b2 and b3, resulting in the bell-shaped segment 416 of S2p, where S2p is seen to first fall to a maximum negative value corresponding to the integration of b2 of value "0," and then slope back up to "0" corresponding to the integration of b3 of value "1" S2p is then held in reset when CLK2Qp is negative.

Similarly, as indicated by S3p in FIG. 4, INT 3 306 of FIG. 3 integrates bits b3 and b4 under control of CLK2IB, and, as indicated by S4p in FIG. 4, INT 4 308 of FIG. 3 integrates bits b4 and b5 under control of CLK2IB.

As indicated by features 418 and 420 of S3p in FIG. 4, integrating two consecutive "1" bits or two consecutive "0" bits results in saturation of the integrated signal. These maximum and minimum limits of integration correspond to the power supply rails of the integrating devices used in this implementation.

Only the positive elements of the differential signals are illustrated in FIG. 4. In all cases, it is assumed that the negative elements of the differential signals are substantially inverted copies of the positive elements of those signals.

Integrator Latches

Each latch utilized in this invention operates by sampling its input on the rising edge of its corresponding input clock, mapping that sample to a logic high or low state, and driving and holding the resulting "registered" state to the latch output until a subsequent rising edge of the input clock causes a transition in the output state. Specifically, for the four latches associated with integrators in FIG. 3, LATCH 1 314 registers S1 on the rising edge of CLK2Q, LATCH 2 316 registers S2 on the rising edge of CLK2IB, LATCH 3 320 registers S3 on the rising edge of CLK2QB, and LATCH 4 320 registers S4 on the rising edge of CLK2I.

As shown in FIG. 4, registration for each of latches 314–320 occurs at or near the mid-point in the integration period of the corresponding integrator. For example, registration for LATCH 1 314 of FIG. 3 is triggered by the rising edge 422 of CLK2Qp, which occurs near the mid-point of segment 408 of the integration period for INT 1 302 of FIG. 3. By registering near the mid-point of each two-UI integration period, as opposed to, for example, registering at the end of a one-UI integration period, the system is more tolerant to skew between the integrator reset control and the corresponding registration clock.

As illustrated by FIG. 3, the combination of the four integrators and their corresponding latches functions as a 1:4 deserializer for SDIN 112, from the serial format of SDIN 112 to a 4-bit "pseudo" parallel format, at one fourth the input data rate. As illustrated by FIG. 4, OD1p, OD2p, OD3p, and OD4p are quarter-rate representations of the serial input data SDIN bits b1, b2, b3, and b4. OD1p, OD2p, OD3p, and OD4p are overlapped in time such that a single quarter-rate clock can be used to register them in parallel and drive them onto a quarter-rate bus. As used in these discussions, the term "quarter-rate" is with respect to the data rate of SDIN 112.

Edge Samplers and Latches

Edge samplers 310 and 312 of FIG. 3 register the data stream at certain data transition edges of SDIN 112. EDGE 1 310 uses the rising edge of CLK2Qp to sample the data at the data transition point corresponding to the mid-point of integration for INT 1 302, while EDGE 2 312 uses the rising edge of CLK2QBp to sample the data at the data transition point corresponding to the mid-point of integration for INT 3 306. LATCH 6 322 and LATCH 7 324 use the rising edges of CLK2IB and CLK2I, respectively, to register the respective outputs S5 and S6 of the edge samplers to synchronize them and stabilize them relative to the local clocking system.

As illustrated in FIG. 4, OT1p is in alignment with OD2p, and OT2p is in alignment with OD4p. In FIG. 4, it is assumed that the edge sampler clocks CLK2Q and CLK2QB are early with respect to the data transition edges of SDIN 112. The outputs thus reflect the value of data just prior to transition. For example, OT1 is "1" (424), because b1 is "1" (402) just prior to the rising edge of CLK2Qp. Similarly, OT2 is "1" (426), because b3 is "1" (428) just prior to the rising edge of CLK2QBp. If CLK2Qp had been late with respect to the data transition following b1, OT1 would be "0" corresponding to the value "0" (430) of b2. However, note that, if CLK2QBp had been late with respect to the data transition following b3, OT2 would still be "1" corresponding to the value "1" (432) of b4. The significance of these relationships is discussed in more detail in the subsequent section describing the operation of phase detector 502 of FIG. 5.

Data Recovery

Referring again to FIG. 2, front-end 202 provides the four-bit parallel signal OD (i.e., bits OD1–4 from latches 314–320 of FIG. 3) to data recovery circuit 204, SYNC circuit 210 performs synchronization to the local sample clocks CLK2I, CLK2IB, CLK2Q, and CLK2QB producing a synchronized version SOC of the clock which will eventually be divided down to produce PRC 120 and a synchronized version SOD of data vector OD. DEMUX circuit 212 is configurable to perform either a further 1:4 deserialization or a 1:5 deserialization, resulting in 16-bit or 20-bit, respectively, parallel RCV data vector (PRD) 118 clocked at one-sixteenth or one-twentieth, respectively, the data rate of SDIN 112.

Clock Recovery and Local Clock Generator

As discussed previously, in addition to processing SDIN 112 to produce 4-bit pseudo parallel output data vector OD, front-end 202 also performs edge sampling on SDIN 112 resulting in 2-bit output timing vector (OT). OD and OT both feed clock recovery circuit 206. Here OD and OT are used by control logic within clock recovery circuit 206 to adjust the phase and frequency of output MIXO relative to local differential reference I and Q clocks from the local receiver VCO/PLL. MIXO is adjusted so that the local sampling clocks CLK2I, CLK1B, CLK2Q, and CLK2QB, generated by divide-by-two, invert, and quadrature-phase shift circuitry of local clock generator 208, are substantially aligned with the data transition edges of SDIN 112 at front-end 202.

Clock Recovery/DLL Background

Clock recovery circuit 206 is based on a delay-locked loop (DLL) that performs continuous phase shifting of local differential reference I and Q clocks from the local receiver VCO/PLL, to create local sampling clocks whose phase is aligned with the transition edges of input data SDIN. A voltage-controlled delay element is employed in a DLL circuit to achieve the delay. One specific element used to realize this voltage-controlled delay is an analog quadrature mixer. With such a mixer, a phase-shifted clock signal MIXO can be produced according to the following equation (1):

$$MIXO = VA \cdot I + VB \cdot Q \qquad (1)$$

where I and Q are the local in-phase and quadrature-phase input differential clock signals to the DLL, respectively, and VA and VB represent first and second differential voltage control signals, respectively, output from charge pumps that are under the control of a phase detector. The phase of output signal MIXO is thus directly controlled by the relative amplitudes of control signals VA and VB.

This general DLL technique has been employed in numerous conventional CDR systems including those described in Lee, T. H., Donnelly, K. S., et al., "A 2.5 V CMOS Delay-Locked Loop for an 18 Mbit, 500 Megabyte/s DRAM," IEEE Journal of Solid-State Circuits (JSSC), vol. 29, no. 12, Dec. 12, 1994, incorporated herein by reference in its entirety.

Further improvements to allow smooth phase interpolation beyond the first quadrant are set forth in Larsson 25-1, Larsson 26-13-2, and in Yang, F., O'Neill, J., et al., "A 1.5V 86 mW/ch 8-Channel 622–3125 Mb/s/ch CMOS SerDes macrocell with Selectable Mux/Demux Ratio," ISSCC 2002, Feb. 4, 2002 ("Yang"), also incorporated herein by reference in its entirety.

Clock Recovery

Figure 5:
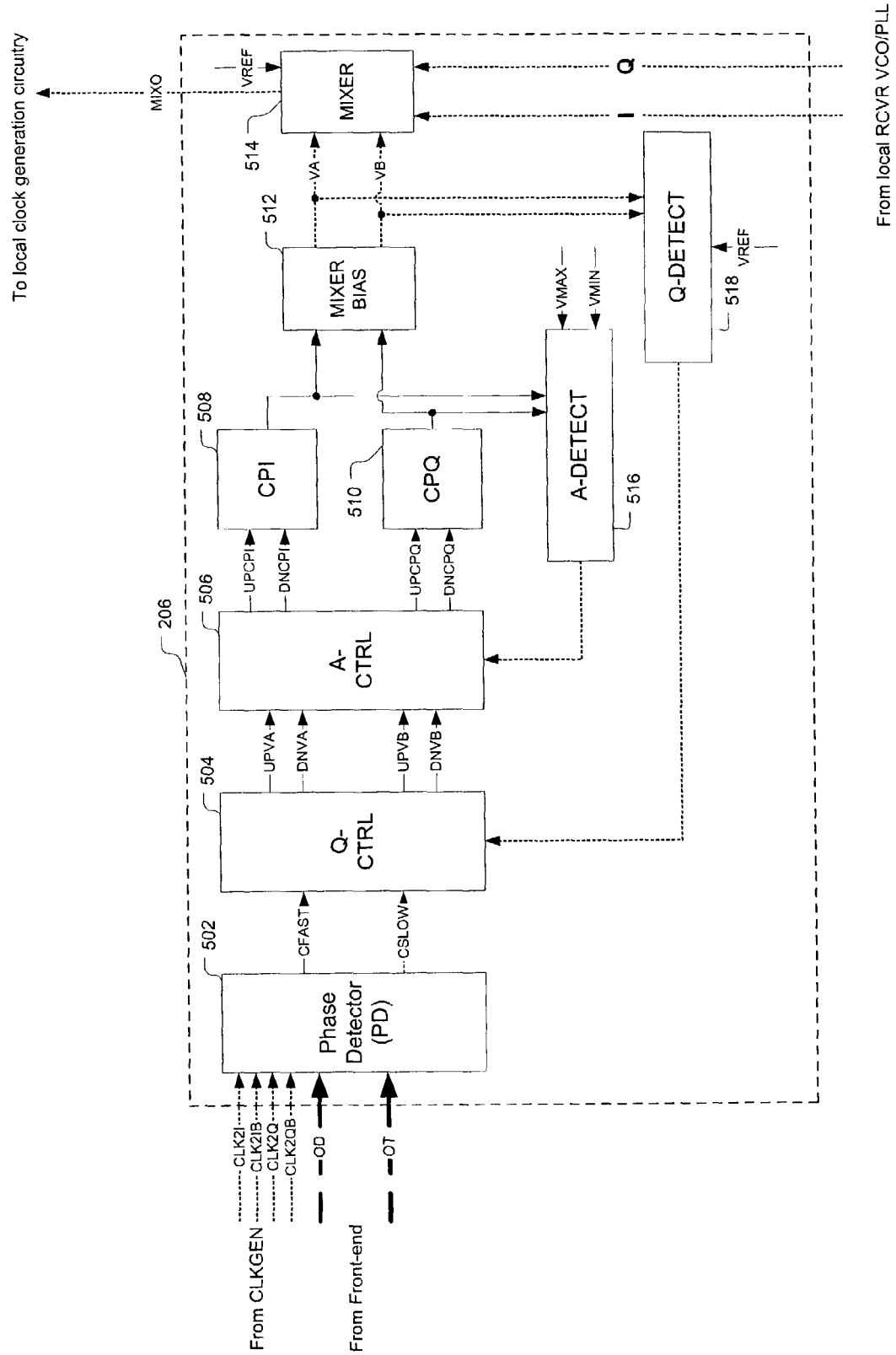
FIG. 5 is a block diagram illustrating clock recovery circuit 206 of FIG. 2.

FIG. 5 shows a block diagram of clock recovery circuit 206 of FIG. 2. As illustrated, circuit 206 includes phase detector (PD) 502, quadrant controller (Q-CTRL) 504, amplitude controller (A-CTRL) 506, charge pumps CPI 508 and CPQ 510, mixer bias circuit 512, amplitude detector (A-DETECT) 516, quadrant detector (Q-DETECT) 518, and mixer 514. Each of these elements is described in turn in the following sections.

Phase Detector

At a high level, PD 502 uses the information in 4-bit data vector OD and 2-bit timing vector OT to decide (on a clock-by-clock basis) whether the locally generated differential clocks CLK2I, CLK2IB, CLK2Q and CLK2QB, which are functions of the output MIXO of mixer 514, are running faster or slower than the intrinsic clock implicit in data stream SDIN 112. If it determines that the local clocks are running fast, the PD 502 asserts a positive pulse on non-differential signal CFAST to quadrant controller (Q-CTRL) 504. Otherwise, if it determines that the local clocks are running slow, then PD 502 asserts a positive pulse on non-differential signal CSLOW to Q-CTRL 504.

Figure 6:
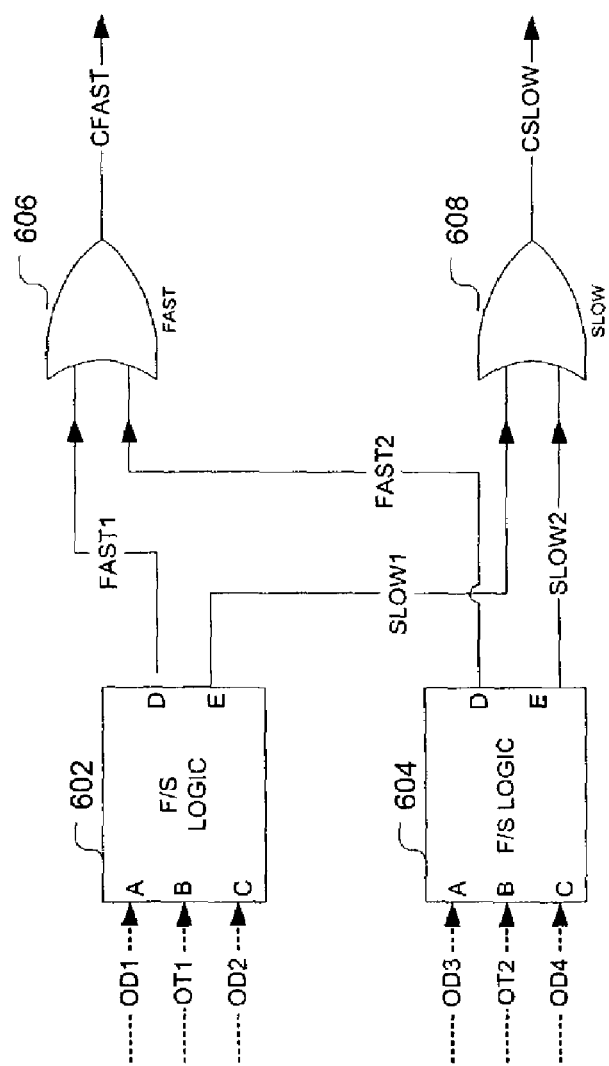
FIG. 6 is a block diagram illustrating the logic of phase detector (PD) 502 of FIG. 5.

FIG. 6 illustrates the logic of CFAST and CSLOW generation performed by PD 502 of FIG. 5. Each of fast/slow (F/S) logic circuits 602 and 604 implements the logic of TABLE 1 of FIG. 7, where F/S logic circuit 602 is fed by OD1, OT1, and OD2, while F/S logic circuit 604 is fed by OD3, OT2, and OD4.

F/S logic circuits 602 and 604 independently determine whether the clock is fast or slow according to the logic in TABLE 1 and output their conclusions to OR gates 606 and 608. F/S logic circuit 602 outputs (a) signal FAST1 to FAST gate 606 and (b) signal SLOW1 to SLOW gate 608. Similarly F/S LOGIC circuit 604 outputs (a) signal FAST2 to FAST gate 606 and (b) signal SLOW2 to SLOW gate 608. Note that alternatively, the OR gates 606 and 608 could each be replaced with a 2 to 1 multiplexor switched to allow the active signals to pass, or equivalently, each OR gate could be replaced with a "wired OR" arrangement.

In TABLE 1, the column headings indicate the input and output ports (and corresponding signals) for F/S logic circuits 602 and 604 of FIG. 6. For F/S logic circuit 602, n=1 and m=1, while, for F/S logic circuit 604, n=3 and m=2. In particular, for F/S logic 602, port A receives OD1, port B receives OT1, port C receives OD2, port D provides FAST1, and port E provides SLOW1. Similarly, for F/S logic 604, port A receives OD3, port B receives OT2, port C receives OD4, port D provides FAST2, and port E provides SLOW2.

Rows 1–8 of TABLE 1 correspond to the eight different possible combinations of input values to ports A, B, and C and the associated outputs provided at ports D and E.

To better understand the logic of TABLE 1, it is useful to refer back to the signal timing diagram of FIG. 4 and the discussion of front-end 202 of FIG. 2. As illustrated by FIG. 4, and as discussed previously, certain segments, e.g., segments 434 and 436, of the output signals OD1 and OD2, respectively, convey (in a manner timed appropriately for F/S logic 602) the logic states of bits b1 402 and b2 430, respectively, of SDIN 112 to F/S logic 602 of FIG. 6. Furthermore, segment 424 of output signal OT1 conveys the logic state of SDIN 112 either just before or just after the transition between b1 and b2 to F/S logic 602.

Similarly, certain segments, e.g., segments 438 and 440, of the output signals OD2 and OD3, respectively, convey (in an appropriately timed manner) the logic states of bits b3 (428) and b4 (432), respectively, of SDIN 112 to F/S logic 604 of FIG. 6. Furthermore, segment 426 of output signal OT2 conveys the value of SDIN 112 either just before or just after the transition between b3 and b4 to F/S logic 604.

If the local sample clocks are early (as indicated, in this case, by the location of rising edge 422 of CLK2Qp, which is used to sample the transition between b1 and b2), then OT1 will reflect the state of SDIN 112 just prior to its transition from b1 to b2, i.e., it will reflect the state of b1. If the local clocks are late, then OT1 will reflect the state of SDIN 112 just after its transition from b1 to b2, i.e., it will reflect the state of b2.

Similarly, for F/S logic 604, if the local sample clocks are early (as indicated, in this case, by the location of the rising edge of CLK2QBp, which is used to sample the transition between b3 and b4), then OT2 will reflect the state of SDIN 112 just prior to its transition from b3 to b4, i.e., it will reflect the state of b3. If the local clocks are late, then OT2 will reflect the state of SDIN 112 just after its transition from b3 to b4, i.e., it will reflect the state of b3.

Thus, when the local clocks are early, the inputs at ports A and B will be equal, and, when the local clocks are late, the inputs at ports B and C will be equal. Referring again to TABLE 1, rows 2 and 7 correspond to occurrences of early clocks, and rows 4 and 5 correspond to occurrences of late clocks. When the local clocks are early, the output at port D should be high, as indicated in rows 2 and 7, and, when the local clocks are late, the output at port E should be high, as indicated in rows 4 and 5.

If b1 equals b2, then OT1 is not used to indicate anything about the timing of the local clocks relative to the timing of the transition of SDIN 112. Similarly, if b3 equals b4, then OT2 is not used to indicate anything about the timing of the local clocks relative to the timing of the transition of SDIN 112. Thus, as indicated in TABLE 1, rows 1, 3, 6, and 8, where the entries in columns A and C are equal, are commented with "don't care." Note that it is possible for CFAST and CSLOW to be both true or both false at a particular point in time given the outputs of F/S logic 602 and 604, but this does not constitute a violation of the operation of the system.

Quadrant Controller and Detector

Referring again to FIG. 5, Q-CTRL 504 receives (a) the CFAST and CSLOW signals from PD 502 and (b) quadrant information related to the current quadrant occupied by the local clock source MIXO from quadrant detector (Q-DETECT) 518. Using this information, Q-CTRL 504 generates non-differential control signals UPVA, DNVA, UPVB, and DNVB, which are driven to amplitude controller (A-CTRL) 506. The outputs provided by Q-CTRL 504 to A-CTRL 506 are directed to ultimately control the voltages of four-quadrant mixer 514 subject to the voltage limits imposed by A-CTRL 506. Q-CTRL 504 is used to update the UPVA, DNVA, UPVB, and DNVB signals so that VA and VB are increased or decreased appropriately, depending on the quadrant in which the output signal vector MIXO is currently located.

Amplitude Controller, Detector and Charge Pumps

A-CTRL 506 uses the outputs of Q-CTRL 504, in addition to information from amplitude detector (A-DETECT) 516, to determine whether the in-phase and quadrature signal charge pumps, CPI 508 and CPQ 510, respectively, should be charged or discharged.

The outputs of charge pumps CPI 508 and CPQ 510 are driven to A-DETECT 516, which compares these values with locally generated reference voltages VMAX and VMIN to determine the amplitude control to feedback to A-CTRL 506. Essentially, if the voltage out of CPI 508 exceeds VMAX, then A-DETECT 516 controls A-CTRL 506 to suppress any pulses that would otherwise be asserted on "up charge pump I" UPCPI. If the voltage out of CPQ 510 exceeds VMAX, then A-DETECT 516 controls A-CTRL 506 to suppress UPCPQ pulses. Similarly, if the either of the voltages out of CPI 508 or CPQ 510 falls below VMIN, then the corresponding "down charge pump" control DNCPI or DNCPQ is suppressed.

Mixer Bias

The outputs of charge pumps CPI 508 and CPQ 510 are also driven to mixer bias 512, where they are converted to fully differential mixer control signals VA and VB, which are driven to mixer 514 and to Q-DETECT 518.

Mixer

Mixer 514 receives differential signals VA and VB from mixer bias 512 along with I and Q components of the local reference clock from the local receiver VCO/PLL 116 of FIG. 1. mixer 514 implements equation (1) and outputs the differential local clock MIXO, which is fed to local clock generator 208 of FIG. 2.

While this invention has been described with reference to illustrative embodiments, this description should not be construed in a limiting sense.

For example, although the present invention has been described in the context of a sampler having four integrators, each of which integrates for two unit intervals (UIs), the present invention is not so limited. In other embodiments, the present invention may be implemented using more or fewer integrators. In addition or alternatively, one or more of the integrators may integrate for periods other than two UIs, with different integrators possibly having different integration periods, including some integrators integrating for only a single UI, as long as at least one integrator integrates for at least two UIs. The number of integrators in the front-end will typically be associated with the degree of deserialization provided by the front-end. In general, a front-end having n integrators will produce n-bit deserialized data.

Other variations on the system include the use of a phase-locked loop as a substitute for circuitry that aligns the phases of the local clocks as a result of information provided by the front-end and phase detectors. Additionally, certain implementations may make use of integration periods that need not be substantially phase-aligned with the incoming data transition edges but instead may overlap those transitions to a greater or lesser extent. Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A method for recovering data from an input data stream, the method comprising the steps of:
   (a) integrating the input data stream using multiple independent integrators that are operating out-of-phase relative to one another, wherein at least one integrator has an integration period of more than one unit interval (UI) and at least one integrator has a non-integration period of more than one UI;
   (b) processing the output of each integrator to recover the data from the input data stream;
   (c) sampling the input data stream substantially during of one or more transitions using one or more edge samplers; and
   (d) generating one or more clocks based on the output of each edge sampler and the recovered data, wherein the one or more clocks are used to determine when to sample the output of each integrator and when to sample the input data stream by each edge sampler, wherein:
   step (a) comprises the step of integrating the input data stream using four independent integrators, each of which integrates the input data stream for substantially two UI and which are staggered in time by one-UI increments; and
   step (b) comprises the step of sampling each integrator substantially at the center of its integration period.

2. A method for recovering data from an input data stream, the method comprising the steps of:
   (a) integrating the input data stream using multiple independent integrators that are operating out-of-phase relative to one another, wherein at least one integrator has an integration period of more than one unit interval (UI) and at least one integrator has a non-integration period of more than one UI;
   (b) processing the output of each integrator to recover the data from the input data stream;
   (c) sampling the input data stream using two edge samplers; and
   (d) generating four sampling clocks based on the outputs of the two edge samplers and the recovered data, wherein the four sampling clocks are staggered in time by one-UI increments, wherein:
   step (a) comprises the step of integrating the input data stream using four independent integrators, each of which integrates the input data stream for substantially two UI and which are staggered in time by one-UI increments;
   step (b) comprises the step of sampling each integrator substantially at the center of its integration period.

3. An apparatus for recovering data from an input data stream, the apparatus comprising:
(a) multiple independent integrators configured to integrate the input data stream, wherein the integrators operate out-of-phase relative to one another, wherein at least one integrator has an integration period of more than one unit interval (UI) and at least one integrator has a non-integration period of more than one UI; and
(b) circuitry configured to process the output of each integrator to recover the data from the input data stream, wherein:
the apparatus comprises four independent integrators staggered in time by one-UI increments, wherein each integrator integrates the input data stream for substantially two UI;
the circuitry is configured to sample each integrator substantially at the center of its integration period;
the apparatus further comprises one or more edge samplers configured to sample the input data stream substantially during one or more transitions; and
the circuitry is configured to generate one or more clocks based on the output of each edge sampler and the recovered data, wherein the one or more clocks are used to determine when to sample the output of each integrators and when to sample the input data stream by each edge sampler.

4. An apparatus for recovering data from an input data stream, the apparatus comprising:
(a) multiple independent integrators configured to integrate the input data stream, wherein the integrators operate out-of-phase relative to one another, wherein at least one integrator has an integration period of more than one unit interval (UI) and at least one integrator has a non-integration period of more than one UI; and
(b) circuitry configured to process the output of each integrator to recover the data from the input data stream, wherein:
the apparatus comprises:
four independent integrators staggered in time by one-UI increments, wherein each integrator integrates the input data stream for substantially two UI; and
two edge samplers; and
the circuitry is configured to:
sample each integrator substantially at the center of its integration period; and
generate four sampling clocks based on the outputs of the two edge samplers and the recovered data, wherein the four sampling clocks are staggered in time by one-UI increments.

5. The invention of claim 1, wherein at least one integrator has intervals of integration interleaved with intervals of non-integration, wherein each interval of integration has a period of more than 1 UI.

6. The invention of claim 5, wherein the at least one integrator is reset during each interval of non-integration.

7. The invention of claim 5, wherein the intervals of integration and the intervals of non-integration are substantially the same length.

8. The invention of claim 1 wherein each integrator:
(1) has intervals of integration interleaved with intervals of non-integration, wherein each interval of integration and each interval of non-integration is substantially the same length, and more than 1 UI;
(2) is sampled substantially at the center of each of its intervals of integration; and
(3) is reset during each interval of non-integration.

9. The invention of claim 1 further comprising the step of recovering a clock signal from the input data stream.

10. The invention of claim 3, wherein at least one integrator has intervals of integration interleaved with intervals of non-integration, wherein each interval of integration has a period of more than 1 UI.

11. The invention of claim 10, wherein the at least one integrator is reset during each interval of non-integration.

12. The invention of claim 10, wherein the intervals of integration and the intervals of non-integration are substantially the same length.

13. The invention of claim 3, wherein each integrator:
(1) has intervals of integration interleaved with intervals of non-integration, wherein each interval of integration and each interval of non-integration is substantially the same length, and more than 1 UI;
(2) is sampled substantially at the center of each of its intervals of integration; and
(3) is reset during each interval of non-integration.

14. The invention of claim 3, further comprising circuitry configured to recover a clock signal from the input data stream.

15. The invention of claim 5, wherein each interval of non-integration has a period of more than one UI.

16. The invention of claim 10, wherein each interval of non-integration has a period of more than one UI.

17. A method for recovering data from an input data stream, the method comprising the steps of:
(a) integrating the input data stream using multiple independent integrators that are operating out-of-phase relative to one another, wherein at least one integrator has an integration period of more than one unit interval (UI);
(b) processing the output of each integrator to recover the data from the input data stream;
(c) sampling the input data stream substantially during one or more transitions using one or more edge samplers; and
(d) generating one or more clocks based on the output of each edge sampler and the recovered data, wherein the one or more clocks are used to determine when to sample the output of each integrator and when to sample the input data stream by each edge sampler; wherein:
step (a) comprises the step of integrating the input data stream using four independent integrators, each of which integrates the input data stream for substantially two UI and which are staggered in time by one-UI increments;
step (b) comprises the step of sampling each integrator substantially at the center of its integration period;
step (c) comprises the step of sampling the input data stream using two edge samplers; and
step (d) comprises the step of generating four sampling clocks based on the outputs of the two edge samplers and the recovered data, wherein the four sampling clocks are staggered in time by one-UI increments.

18. An apparatus for recovering data from an input data stream, the apparatus comprising:
(a) multiple independent integrators configured to integrate the input data stream, wherein the integrators operate out-of-phase relative to one another, wherein at least one integrator has an integration period of more than one unit interval (UI);
(b) circuitry configured to process the output of each integrator to recover the data from the input data stream;

(c) one or more edge samplers configured to sample the input data stream substantially during one or more transitions; and
(d) the circuitry is configured to generate one or more clocks based on the output of each edge sampler and the recovered data, wherein the one or more clocks are used to determine when to sample the output of each integrator and when to sample the input data stream by each edge sampler; wherein:

the apparatus comprises:
  four independent integrators staggered in time by one-UI increments, wherein each integrator integrates the input data stream for substantially two UI; and
  two edge samplers; and
the circuitry is configured to:
  sample each integrator substantially at the center of its integration period; and
  generate four sampling clocks based on the outputs of the two edge samplers and the recovered data, wherein the four sampling clocks are staggered in time by one-UI increments.

* * * * *